(12) United States Patent
Holden et al.

(10) Patent No.: US 12,057,976 B2
(45) Date of Patent: Aug. 6, 2024

(54) VECTOR SIGNALING CODE WITH IMPROVED NOISE MARGIN

(71) Applicant: Kandou Labs, S.A., Lausanne (CH)

(72) Inventors: Brian Holden, Monte Sereno, CA (US); Amin Shokrollahi, Préverenges (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 18/363,424

(22) Filed: Aug. 1, 2023

(65) Prior Publication Data
US 2023/0379199 A1    Nov. 23, 2023

Related U.S. Application Data (63) Continuation of application No. 17/590,450, filed on Feb. 1, 2022, now Pat. No. 11,716,227, which is a continuation of application No. 16/449,145, filed on Jun. 21, 2019, now Pat. No. 11,240,076, which is a continuation-in-part of application No. 15/363,197,
(Continued)

(51) Int. Cl.
| | |
|---|---|
| H04L 25/49 | (2006.01) |
| B41J 2/00 | (2006.01) |
| H03M 5/14 | (2006.01) |
| H04J 13/12 | (2011.01) |
| H04J 13/16 | (2011.01) |

(Continued)

(52) U.S. Cl.
CPC ............ *H04L 25/4917* (2013.01); *B41J 2/00* (2013.01); *H03M 5/145* (2013.01); *H04J 13/12* (2013.01); *H04J 13/16* (2013.01); *H04L 1/00* (2013.01); *H04L 1/0041* (2013.01); *H04L 25/02* (2013.01); *H04L 25/0272* (2013.01); *H04L 25/49* (2013.01); *H04L 25/4906* (2013.01)

(58) Field of Classification Search
CPC ..... H04L 25/4917; H04L 1/00; H04L 1/0041; H04L 25/02; H04L 25/0272; H04L 25/49; H04L 25/4906; H04L 1/0045; H04L 1/0057; B41J 2/00; H03M 5/145; H03M 5/18; H04J 13/12; H04J 13/16
See application file for complete search history.

(56) References Cited

U.S. PATENT DOCUMENTS

| | | |
|---|---|---|
| 3,196,351 A | 7/1965 | David |
| 3,970,795 A | 7/1976 | Allen |

(Continued)

FOREIGN PATENT DOCUMENTS

| | | |
|---|---|---|
| CN | 1864346 A | 11/2006 |
| CN | 101854223 A | 10/2010 |

(Continued)

OTHER PUBLICATIONS

Abbasfar, Aliazam, "Generalized Differential Vector Signaling", IEEE International Conference on Communications, ICC '09, Jun. 14, 2009, 1-5 (5 pages).

(Continued)

*Primary Examiner* — Vineeta S Panwalkar (57) ABSTRACT

Methods are described allowing a vector signaling code to encode multi-level data without the significant alphabet size increase known to cause symbol dynamic range compression and thus increased noise susceptibility. By intentionally restricting the number of codewords used, good pin efficiency may be maintained along with improved system signal-to-noise ratio.

20 Claims, 10 Drawing Sheets

Related U.S. Application Data filed on Nov. 29, 2016, now Pat. No. 10,333,749, which is a continuation of application No. 14/711,528, filed on May 13, 2015, now Pat. No. 9,509,437.

(60) Provisional application No. 61/992,711, filed on May 13, 2014.

(51) Int. Cl.
  *H04L 1/00* (2006.01)
  *H04L 25/02* (2006.01)

(56) References Cited

U.S. PATENT DOCUMENTS

| | | |
|---|---|---|
| 4,163,258 A | 7/1979 | Ebihara et al. |
| 4,499,550 A | 2/1985 | Ray et al. |
| 5,053,974 A | 10/1991 | Penz |
| 5,166,956 A | 11/1992 | Baltus et al. |
| 5,311,516 A | 5/1994 | Kuznicki et al. |
| 5,331,320 A | 7/1994 | Cideciyan et al. |
| 5,412,689 A | 5/1995 | Chan et al. |
| 5,449,895 A | 9/1995 | Hecht et al. |
| 5,553,097 A | 9/1996 | Dagher |
| 5,856,935 A | 1/1999 | Moy et al. |
| 5,982,954 A | 11/1999 | Delen et al. |
| 6,005,895 A | 12/1999 | Perino et al. |
| 6,084,883 A | 7/2000 | Norrell et al. |
| 6,084,958 A | 7/2000 | Blossom |
| 6,097,732 A | 8/2000 | Jung |
| 6,111,895 A | 8/2000 | Miller et al. |
| 6,154,498 A | 11/2000 | Dabral et al. |
| 6,226,330 B1 | 5/2001 | Mansur |
| 6,278,740 B1 | 8/2001 | Nordyke |
| 6,317,465 B1 | 11/2001 | Akamatsu et al. |
| 6,359,931 B1 | 3/2002 | Perino et al. |
| 6,378,073 B1 | 4/2002 | Davis et al. |
| 6,398,359 B1 | 6/2002 | Silverbrook et al. |
| 6,452,420 B1 | 9/2002 | Wong |
| 6,483,828 B1 | 11/2002 | Balachandran et al. |
| 6,504,875 B2 | 1/2003 | Perino et al. |
| 6,556,628 B1 | 4/2003 | Poulton et al. |
| 6,621,427 B2 | 9/2003 | Greenstreet |
| 6,621,945 B2 | 9/2003 | Bissessur |
| 6,650,638 B1 | 11/2003 | Walker et al. |
| 6,661,355 B2 | 12/2003 | Cornelius et al. |
| 6,766,342 B2 | 7/2004 | Kechriotis |
| 6,865,236 B1 | 3/2005 | Terry |
| 6,876,317 B2 | 4/2005 | Sankaran |
| 6,898,724 B2 | 5/2005 | Chang |
| 6,954,492 B1 | 10/2005 | Williams |
| 6,990,138 B2 | 1/2006 | Bejjani et al. |
| 6,999,516 B1 | 2/2006 | Rajan |
| 7,023,817 B2 | 4/2006 | Kuffner et al. |
| 7,039,136 B2 | 5/2006 | Olson et al. |
| 7,075,996 B2 | 7/2006 | Simon et al. |
| 7,127,003 B2 | 10/2006 | Rajan et al. |
| 7,142,612 B2 | 11/2006 | Horowitz et al. |
| 7,167,523 B2 | 1/2007 | Mansur |
| 7,180,949 B2 | 2/2007 | Kleveland et al. |
| 7,184,483 B2 | 2/2007 | Rajan |
| 7,269,212 B1 | 9/2007 | Chau et al. |
| 7,356,213 B1 | 4/2008 | Cunningham et al. |
| 7,358,869 B1 | 4/2008 | Chiarulli et al. |
| 7,400,276 B1 | 7/2008 | Sotiriadis et al. |
| 7,496,130 B2 | 2/2009 | Rumney |
| 7,633,850 B2 | 12/2009 | Ahn |
| 7,656,321 B2 | 2/2010 | Wang |
| 7,706,456 B2 | 4/2010 | Laroia et al. |
| 7,746,764 B2 | 6/2010 | Rawlins et al. |
| 7,868,790 B2 | 1/2011 | Bae |
| 7,869,546 B2 | 1/2011 | Tsai |
| 7,899,653 B2 | 3/2011 | Hollis |
| 8,050,332 B2 | 11/2011 | Chung et al. |
| 8,055,095 B2 | 11/2011 | Palotai et al. |
| 8,149,906 B2 | 4/2012 | Saito et al. |
| 8,159,375 B2 | 4/2012 | Abbasfar |
| 8,159,376 B2 | 4/2012 | Abbasfar |
| 8,199,849 B2 | 6/2012 | Oh et al. |
| 8,199,863 B2 | 6/2012 | Chen et al. |
| 8,218,670 B2 | 7/2012 | Abou |
| 8,245,094 B2 | 8/2012 | Jiang et al. |
| 8,279,745 B2 | 10/2012 | Dent |
| 8,279,976 B2 | 10/2012 | Lin et al. |
| 8,284,848 B2 | 10/2012 | Nam et al. |
| 8,289,914 B2 | 10/2012 | Li et al. |
| 8,295,250 B2 | 10/2012 | Gorokhov et al. |
| 8,365,035 B2 | 1/2013 | Hara |
| 8,472,513 B2 | 6/2013 | Malipatil et al. |
| 8,498,368 B1 | 7/2013 | Husted et al. |
| 8,520,493 B2 | 8/2013 | Goulahsen |
| 8,539,318 B2 | 9/2013 | Shokrollahi et al. |
| 8,577,284 B2 | 11/2013 | Seo et al. |
| 8,588,254 B2 | 11/2013 | Diab et al. |
| 8,588,280 B2 | 11/2013 | Oh et al. |
| 8,593,305 B1 | 11/2013 | Tajalli et al. |
| 8,620,166 B2 | 12/2013 | Guha |
| 8,644,497 B2 | 2/2014 | Clausen et al. |
| 8,649,445 B2 | 2/2014 | Cronie et al. |
| 8,687,968 B2 | 4/2014 | Nosaka et al. |
| 8,718,184 B1 | 5/2014 | Cronie et al. |
| 8,731,039 B1 | 5/2014 | Sarrigeorgidis et al. |
| 8,755,426 B1 | 6/2014 | Cronie et al. |
| 8,773,964 B2 | 7/2014 | Hsueh et al. |
| 8,780,687 B2 | 7/2014 | Clausen et al. |
| 8,831,440 B2 | 9/2014 | Yu et al. |
| 8,879,660 B1 | 11/2014 | Peng et al. |
| 8,938,171 B2 | 1/2015 | Tang et al. |
| 8,949,693 B2 | 2/2015 | Ordentlich et al. |
| 8,989,317 B1 | 3/2015 | Holden et al. |
| 8,996,740 B2 | 3/2015 | Wiley et al. |
| 9,015,566 B2 | 4/2015 | Cronie et al. |
| 9,071,476 B2 | 6/2015 | Fox et al. |
| 9,077,386 B1 | 7/2015 | Holden et al. |
| 9,100,232 B1 | 8/2015 | Hormati et al. |
| 9,197,470 B2 | 11/2015 | Okunev |
| 9,246,713 B2 | 1/2016 | Shokrollahi |
| 9,251,873 B1 | 2/2016 | Fox et al. |
| 9,288,082 B1 | 3/2016 | Ulrich et al. |
| 9,288,089 B2 | 3/2016 | Cronie et al. |
| 9,331,962 B2 | 5/2016 | Lida et al. |
| 9,362,974 B2 | 6/2016 | Fox et al. |
| 9,363,114 B2 | 6/2016 | Shokrollahi et al. |
| 9,401,828 B2 | 7/2016 | Cronie et al. |
| 9,432,082 B2 | 8/2016 | Ulrich et al. |
| 9,461,862 B2 | 10/2016 | Holden et al. |
| 9,479,369 B1 | 10/2016 | Shokrollahi |
| 9,509,437 B2 | 11/2016 | Shokrollahi |
| 9,537,644 B2 | 1/2017 | Jones et al. |
| 9,634,797 B2 | 4/2017 | Benammar et al. |
| 9,667,379 B2 | 5/2017 | Cronie et al. |
| 9,710,412 B2 | 7/2017 | Sengoku |
| 9,825,677 B2 | 11/2017 | Cronie et al. |
| 10,055,372 B2 | 8/2018 | Shokrollahi |
| 2001/0006538 A1 | 7/2001 | Simon et al. |
| 2001/0055294 A1 | 12/2001 | Motoyoshi |
| 2002/0044316 A1 | 4/2002 | Myers |
| 2002/0152340 A1 | 10/2002 | Dreps et al. |
| 2002/0174373 A1 | 11/2002 | Chang |
| 2002/0181607 A1 | 12/2002 | Izumi |
| 2003/0086366 A1 | 5/2003 | Branlund et al. |
| 2003/0087634 A1 | 5/2003 | Raghavan et al. |
| 2004/0057525 A1 | 3/2004 | Rajan et al. |
| 2004/0141567 A1 | 7/2004 | Yang et al. |
| 2004/0146117 A1 | 7/2004 | Subramaniam et al. |
| 2004/0155802 A1 | 8/2004 | Lamy et al. |
| 2004/0161019 A1 | 8/2004 | Raghavan et al. |
| 2004/0239374 A1 | 12/2004 | Hori |
| 2005/0213686 A1 | 9/2005 | Love et al. |
| 2006/0013331 A1 | 1/2006 | Choi et al. |
| 2006/0056538 A1 | 3/2006 | Nam et al. |
| 2006/0126751 A1 | 6/2006 | Bessios |
| 2006/0159005 A1 | 7/2006 | Rawlins et al. |
| 2006/0251421 A1 | 11/2006 | Arnon |
| 2006/0291589 A1 | 12/2006 | Eliezer et al. |

(56) References Cited

U.S. PATENT DOCUMENTS

| | | |
|---|---|---|
| 2007/0030796 A1 | 2/2007 | Green |
| 2007/0070967 A1 | 3/2007 | Yang et al. |
| 2007/0265533 A1 | 11/2007 | Tran |
| 2008/0043677 A1 | 2/2008 | Kim et al. |
| 2008/0104374 A1 | 5/2008 | Mohamed |
| 2008/0192621 A1 | 8/2008 | Suehiro |
| 2008/0316070 A1 | 12/2008 | Van et al. |
| 2009/0046009 A1 | 2/2009 | Fujii |
| 2009/0059782 A1 | 3/2009 | Cole |
| 2009/0110106 A1 | 4/2009 | Wornell et al. |
| 2009/0154604 A1 | 6/2009 | Lee et al. |
| 2010/0023838 A1 | 1/2010 | Shen et al. |
| 2010/0046644 A1 | 2/2010 | Mazet |
| 2010/0054355 A1 | 3/2010 | Kinjo et al. |
| 2010/0081451 A1 | 4/2010 | Mueck et al. |
| 2010/0215112 A1 | 8/2010 | Tsai et al. |
| 2010/0235673 A1 | 9/2010 | Abbasfar |
| 2010/0296556 A1 | 11/2010 | Rave et al. |
| 2010/0309964 A1 | 12/2010 | Oh et al. |
| 2011/0014865 A1 | 1/2011 | Seo et al. |
| 2011/0018749 A1 | 1/2011 | Muto et al. |
| 2011/0072330 A1 | 3/2011 | Kolze |
| 2011/0122767 A1 | 5/2011 | Dent |
| 2011/0134678 A1 | 6/2011 | Sato et al. |
| 2011/0235501 A1 | 9/2011 | Goulahsen |
| 2011/0268225 A1 | 11/2011 | Cronie et al. |
| 2011/0286497 A1 | 11/2011 | Nervig |
| 2011/0299555 A1 | 12/2011 | Cronie et al. |
| 2011/0302478 A1 | 12/2011 | Cronie et al. |
| 2012/0177385 A1 | 7/2012 | Guha |
| 2012/0213299 A1 | 8/2012 | Cronie et al. |
| 2012/0257683 A1 | 10/2012 | Schwager et al. |
| 2013/0010892 A1 | 1/2013 | Cronie et al. |
| 2013/0013870 A1 | 1/2013 | Cronie et al. |
| 2013/0114392 A1 | 5/2013 | Sun et al. |
| 2013/0195155 A1 | 8/2013 | Pan et al. |
| 2013/0202001 A1 | 8/2013 | Zhang |
| 2013/0259113 A1 | 10/2013 | Kumar |
| 2014/0006649 A1 | 1/2014 | Wiley et al. |
| 2014/0177645 A1 | 6/2014 | Cronie et al. |
| 2014/0254642 A1 | 9/2014 | Fox et al. |
| 2015/0078479 A1 | 3/2015 | Whitby-Strevens |
| 2015/0222458 A1 | 8/2015 | Hormati et al. |
| 2015/0236885 A1 | 8/2015 | Ling et al. |
| 2015/0249559 A1 | 9/2015 | Shokrollahi et al. |
| 2015/0333940 A1 | 11/2015 | Shokrollahi |
| 2015/0349835 A1 | 12/2015 | Fox et al. |
| 2015/0365263 A1 | 12/2015 | Zhang et al. |
| 2015/0380087 A1 | 12/2015 | Mittelholzer et al. |
| 2015/0381768 A1 | 12/2015 | Fox et al. |
| 2016/0020824 A1 | 1/2016 | Ulrich et al. |
| 2016/0036616 A1 | 2/2016 | Holden et al. |
| 2016/0218894 A1 | 7/2016 | Fox et al. |
| 2016/0338040 A1 | 11/2016 | Lee et al. |
| 2016/0380787 A1 | 12/2016 | Hormati et al. |
| 2017/0272285 A1 | 9/2017 | Shokrollahi et al. |
| 2019/0103903 A1 | 4/2019 | Yang |
| 2020/0321778 A1 | 10/2020 | Gharibdoust et al. |
| 2021/0297292 A1 | 9/2021 | Hormati |

FOREIGN PATENT DOCUMENTS

| | | |
|---|---|---|
| CN | 114142964 A | 3/2022 |
| JP | 2003163612 A | 6/2003 |
| JP | 4394755 B2 | 10/2009 |
| WO | 2005032000 A1 | 4/2005 |
| WO | 2009084121 A1 | 7/2009 |
| WO | 2010031824 A1 | 3/2010 |
| WO | 2019241081 A1 | 12/2019 |

OTHER PUBLICATIONS

Anonymous, "Constant-weight code", Wikipedia.org, retrieved on Feb. 6, 2017, (3 pages).

Counts, Lew, et al., "One-Chip "Slide Rule" Works with Logs, Antilogs for Real-Time Processing", Analog Devices, Computational Products 6, Reprinted from Electronic Design, May 2, 1985, 3-9 (7 pages).

Dasilva, Victor, et al., "Multicarrier Orthogonal CDMA Signals for Quasi-Synchronous Communication Systems", IEEE Journal on Selected Areas in Communications, vol. 12, No. 5, Jun. 1994, 842-852 (11 pages).

Farzan, Kamran, et al., "Coding Schemes for Chip-to-Chip Interconnect Applications", IEEE Transactions on Very Large Scale Integration (VLSI) Systems, vol. 14, No. 4, Apr. 2006, 393-406 (14 pages).

Giovaneli, Carlos Lopez, et al., "Space-Frequency Coded OFDM System for Multi-Wire Power Line Communications", Power Line Communications and Its Applications, 2005 International Symposium on Vancouver, BC, Canada, IEEE XP-002433844, Apr. 6-8, 2005, 191-195 (5 pages).

Healey, Adam, et al., "A Comparison of 25 Gbps NRZ & PAM-4 Modulation used in Legacy & Premium Backplane Channels", Tyco Electronics Corporation, DesignCon 2012, Jan. 2012, 1-16 (16 pages).

Holden, Brian, "An exploration of the technical feasibility of the major technology options for 400GE backplanes", IEEE 802.3 400GE Study Group, Geneva, CH, Jul. 16, 2013, 1-18 (18 pages).

Holden, Brian, "Simulation results for NRZ, ENRZ & PAM-4 on 16-wire full-sized 400GE backplanes", IEEE 802.3 400GE Study Group, York, UK, Sep. 2, 2013, 1-19 (19 pages).

Holden, Brian, "Using Ensemble NRZ Coding for 400GE Electrical Interfaces", IEEE 802.3 400GE Study Group, May 17, 2013, 1-24 (24 pages).

Jiang, Anxiao, et al., "Rank Modulation for Flash Memories", IEEE Transactions of Information Theory, vol. 55, No. 6, Jun. 2009, 2659-2673 (16 pages).

Oh, Dan, et al., "Pseudo-Differential Vector Signaling for Noise Reduction in Single-Ended Signaling Systems", DesignCon 2009, Rambus Inc., Jan. 2009, (22 pages).

Penttinen, Jyrki, et al., "Performance Model for Orthogonal Sub Channel in Noise-limited Environment", Sixth International Conference on Wireless and Mobile Communications, 2010, 56-61 (6 pages).

Poulton, John, "Multiwire Differential Signaling", UNC-CH Department of Computer Science Version 1.1, Aug. 6, 2003, 1-20 (20 pages).

She, James, et al., "A Framework of Cross-Layer Superposition Coded Multicast for Robust IPTV Services over WiMAX", IEEE Wireless Communications and Networking Conference, Apr. 15, 2008, 3139-3144 (6 pages).

Skliar, Osvaldo, et al., "A Method For the Analysis of Signals: the Square-Wave Method", Revista de Matematica: Teoria y Aplicationes, vol. 15, No. 2, Mar. 2008, 109-129 (21 pages).

Slepian, David, "Permutation Modulation", Proceedings of the IEE, vol. 53, No. 3, Mar. 1965, 228-236 (9 pages).

Wada, Tadahiro, et al., "A Study on Orthogonal Multi-Code CDMA Systems Using Constant Amplitude Coding", Technical Report of IEICE, vol. 97, No. 132, Jun. 24, 1997, 19-24 (6 pages).

Wang, Xin, et al., "Applying CDMA Technique to Network-on-Chip", IEEE Transactions on Very Large Scale Integration (VLSI) Systems, vol. 15, No. 10, Oct. 1, 2007, 1091-1100 (10 pages).

Zhang, Geng, et al., "A CNRZ-7 Based Wireline Transceiver With High-Bandwidth-Density, Low-Power for D2D Communication", IEEE Access, vol. 10, 2022, Sep. 2, 1902, 96556-96567 (12 pages).

VECTOR SIGNALING CODE WITH IMPROVED NOISE MARGIN

CROSS-REFERENCE TO RELATED APPLICATIONS

This application is a continuation of U.S. application Ser. No. 17/590,450, filed Feb. 1, 2022, entitled "Vector Signaling Code with Improved Noise Margin", which is a continuation of U.S. application Ser. No. 16/449,145, filed Jun. 21, 2019, now U.S. Pat. No. 11,240,076, granted Feb. 1, 2022, entitled "Vector Signaling Code with Improved Noise Margin", which is a continuation in part of U.S. application Ser. No. 15/363,197, filed Nov. 29, 2016, now U.S. Pat. No. 10,333,749, granted Jun. 25, 2019, entitled "Vector Signaling Code with Improved Noise Margin", which is a continuation of U.S. application Ser. No. 14/711,528, filed May 13, 2015, now U.S. Pat. No. 9,509,437, granted Nov. 29, 2016, entitled "Vector Signaling Code with Improved Noise Margin", which claims the benefit of U.S. Provisional Patent Application 61,992,711, filed May 13, 2014, entitled "Vector Signaling Code with Improved Noise Margin" all of which are herein incorporated by reference in their entireties for all purposes.

REFERENCES

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication No. 2011/0302478 of U.S. patent application Ser. No. 13/154,009, filed Jun. 6, 2011, naming Harm Cronie and Amin Shokrollahi, entitled "Error Control Coding for Orthogonal Differential Vector Signaling" (hereinafter "Cronie II");

U.S. patent application Ser. No. 13/030,027, filed Feb. 17, 2011, now U.S. Pat. No. 8,649,445, granted Feb. 11, 2014, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III");

U.S. Patent Publication No. 2011/0299555 of U.S. patent application Ser. No. 13/154,009, filed Jun. 6, 2011, naming Harm Cronie and Amin Shokrollahi, entitled "Error Control Coding for Orthogonal Differential Vector Signaling" (hereinafter "Cronie IV");

U.S. Provisional Patent Application No. 61/763,403, filed Feb. 11, 2013, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Chip-to-Chip Communications Interface" (hereinafter called "Fox I");

U.S. Provisional Patent Application No. 61/773,709, filed Mar. 6, 2013, naming John Fox, Brian Holden, Peter Hunt, John D Keay, Amin Shokrollahi, Andrew Kevin John Stewart, Giuseppe Surace, and Roger Ulrich, entitled "Methods and Systems for High Bandwidth Chip-to-Chip Communications Interface" (hereinafter called "Fox II");

U.S. Provisional Patent Application No. 61/812,667, filed Apr. 16, 2013, naming John Fox, Brian Holden, Ali Hormati, Peter Hunt, John D Keay, Amin Shokrollahi, Anant Singh, Andrew Kevin John Stewart, and Giuseppe Surace, entitled "Methods and Systems for High Bandwidth Communications Interface" (hereinafter called "Fox III");

U.S. patent application Ser. No. 13/842,740, filed Mar. 15, 2013, now U.S. Pat. No. 9,300,503, granted Mar. 29, 2016, naming Brian Holden, Amin Shokrollahi, and Anant Singh, entitled "Methods and Systems for Skew Tolerance and Advanced Detectors for Vector Signaling Codes for Chip-to-Chip Communication" (hereinafter called "Holden I");

U.S. patent application Ser. No. 13/895,206, filed May 15, 2013, now U.S. Pat. No. 9,288,082, granted Mar. 15, 2016, naming Roger Ulrich and Peter Hunt, entitled "Circuits for Efficient Detection of Vector Signaling Codes for Chip-to-Chip Communications using Sums of Differences" (hereinafter called "Ulrich I").

U.S. Provisional Patent Application No. 61/934,804, filed Feb. 2, 2014, naming Ali Hormati and Amin Shokrollahi, entitled "Method for Code Evaluation using ISI Ratio" (hereinafter called "Hormati I").

U.S. Provisional Patent Application No. 61/839,360, filed Jun. 23, 2013, naming Amin Shokrollahi, entitled "Vector Signaling Codes with Reduced Receiver Complexity" (hereinafter called "Shokrollahi I").

U.S. Patent Application No. 61/934,800, filed Feb. 2, 2014, naming Amin Shokrollahi and Nicolae Chiurtu, entitled "Low EMI Signaling for Parallel Conductor Interfaces" (hereinafter called "Shokrollahi II").

TECHNICAL FIELD

The present invention relates to communications in general and in particular to the transmission of signals capable of conveying information and detection of those signals in chip-to-chip communication.

BACKGROUND

In communication systems, a goal is to transport information from one physical location to another. It is typically desirable that the transport of this information is reliable, is fast and consumes a minimal amount of resources. One common information transfer medium is the serial communications link, which may be based on a single wire circuit relative to ground or other common reference, or multiple such circuits relative to ground or other common reference. A common example uses singled-ended signaling ("SES"). SES operates by sending a signal on one wire, and measuring the signal relative to a fixed reference at the receiver. A serial communication link may also be based on multiple circuits used in relation to each other. A common example of the latter uses differential signaling ("DS"). Differential signaling operates by sending a signal on one wire and the opposite of that signal on a matching wire. The signal information is represented by the difference between the wires, rather than their absolute values relative to ground or other fixed reference.

There are a number of signaling methods that maintain the desirable properties of DS while increasing pin efficiency over DS. Vector signaling is a method of signaling. With vector signaling, a plurality of signals on a plurality of wires is considered collectively although each of the plurality of signals might be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector might refer to the number of degrees of freedom of signals on the plurality of wires instead of exactly the number of wires in the plurality of wires.

With binary vector signaling, each component or "symbol" of the vector takes on one of two possible values. With non-binary vector signaling, each symbol has a value that is a selection from a set of more than two possible values. The set of values that a symbol of the vector may take on is called the "alphabet" of the vector signaling code. A vector signaling code, as described herein, is a collection C of vectors of the same length N, called codewords. Any suitable subset of a vector signaling code denotes a "sub code" of that code. Such a subcode may itself be a vector signaling code.

In operation, the coordinates of the codewords are bounded, and we choose to represent them by real numbers between −1 and 1. The ratio between the binary logarithm of the size of C and the length N is called the pin-efficiency of the vector signaling code.

A vector signaling code is called "balanced" if for all its codewords the sum of the coordinates is always zero. Balanced vector signaling codes have several important properties. For example, as is well known to those of skill in the art, balanced codewords lead to lower electromagnetic interference (EMI) noise than non-balanced ones. Also, if common mode resistant communication is required, it is advisable to use balanced codewords, since otherwise power is spent on generating a common mode component that is cancelled at the receiver.

Figure 1:
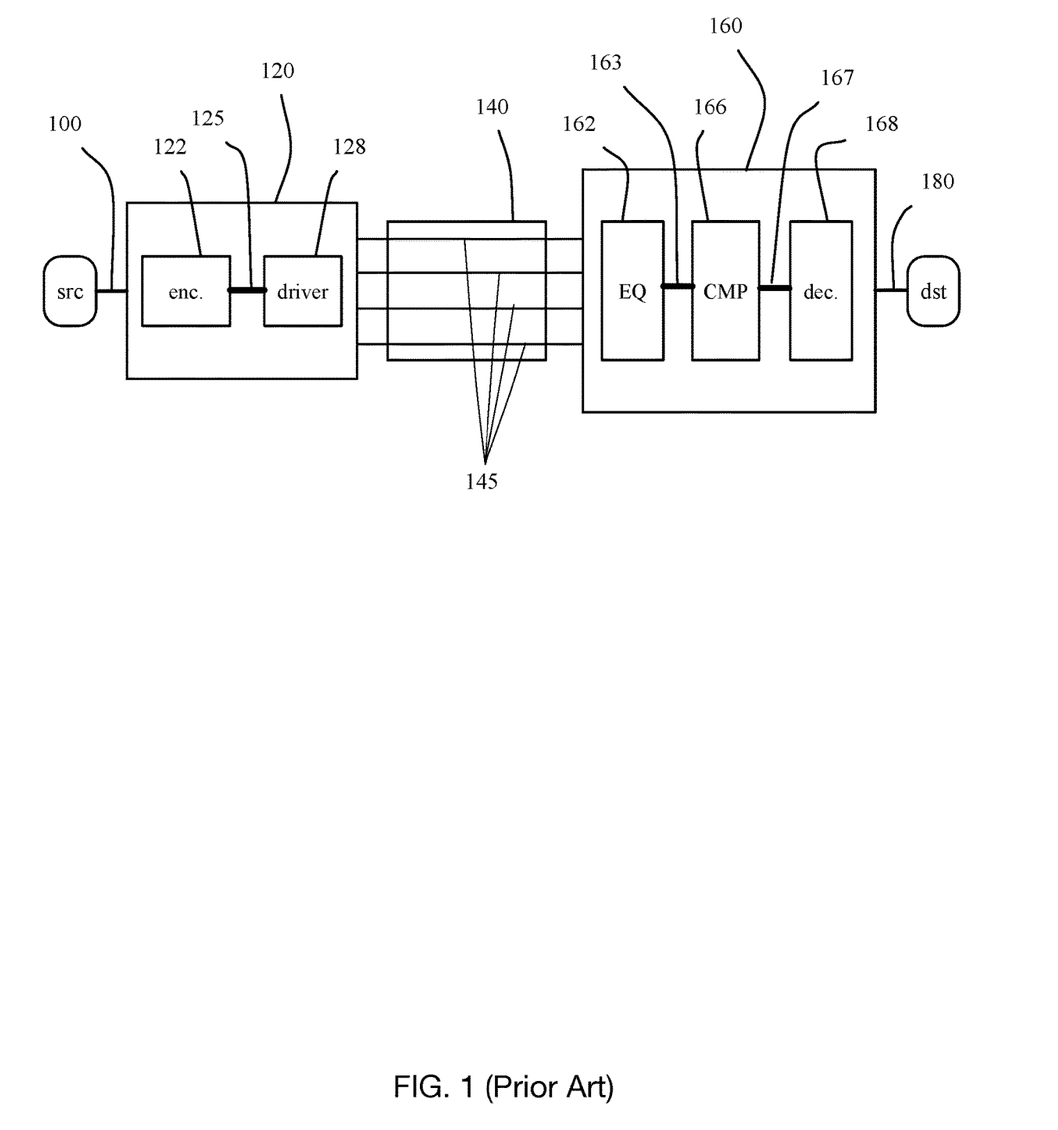
FIG. 1 is an example of a typical prior art systems environment incorporating vector signaling code communication.

An example of a typical systems environment incorporating vector signaling code communication as described in the prior art is shown in FIG. 1. As will be subsequently described, one goal of the present invention is to provide improved performance, particularly regarding signal to noise ratio, while maintaining as much as possible this systems environment.

Information to be transmitted 100 is obtained from a source SRC and presented to transmitter 120. Within the transmitter, the information is encoded 122 as symbols of a vector signaling code 125, which are then presented to transmit driver 128, generating physical representations of the code symbols on a collection of wires 145 which together comprise the communications channel 140.

Receiver 160 accepts physical signals from communications channel 140, detects the received codewords using, as one example, a collection of differential binary multi-input comparators (as taught by Holden I) 166, and then decodes 168 those detected values 167 to obtain the received information 180 output to a destination device DST. For some preferred encoder mappings, detected binary values 167 may map directly to bits of received information 180, making an explicit decoding operation unnecessary.

In a practical embodiment, signals 145 may undergo significant change in amplitude, waveform, and other characteristics between emission by transmitter 120 and arrival at receiver 160, due to the transmission characteristics of communications channel 140. Therefore, it is common practice to incorporate signal amplification and/or equalization 162 into communications channel receivers.

Additional examples of vector signaling methods are described in Cronie I, Cronie II, Cronie III, Cronie IV, Fox I, Fox II, Fox III, Holden I, Shokrollahi I, Shokrollahi II, and Hormati I.

BRIEF DESCRIPTION

Combining multi-level signaling with a vector signaling code results in significant increase in the number of available codewords. Properties and the construction method of such combinations are disclosed where the number of active codewords in the combined code is intentionally restricted to provide increased detection threshold for receive detectors, thus improving the signal-to-noise ratio of the resulting system.

DETAILED DESCRIPTION

When using the Hadamard Transform, or some other orthogonal transform, to construct vector signaling codes the code alphabet size may grow to be considerably larger than that of the input data alphabet. As one example, the ENRZ code described in FOX II and called H4 code by Cronie I encodes three binary data bits into a four element codeword with a four value alphabet. Typically, the larger the code alphabet size, the smaller the swing at the comparator outputs used to detect the code, and therefore the smaller the SNR of the system in terms of vertical eye opening. In the case of ENRZ, the code is constrained to only require two of the four possible alphabet values in any given codeword, thus avoiding this problem. For codes not naturally providing such constraints, it may be desirable to decrease the code alphabet size at the expense of (slightly) lowering the pin-efficiency. Methods are described to achieve this kind of tradeoff.

Multi-level data and Orthogonal Vector Signaling code

Figure 2:
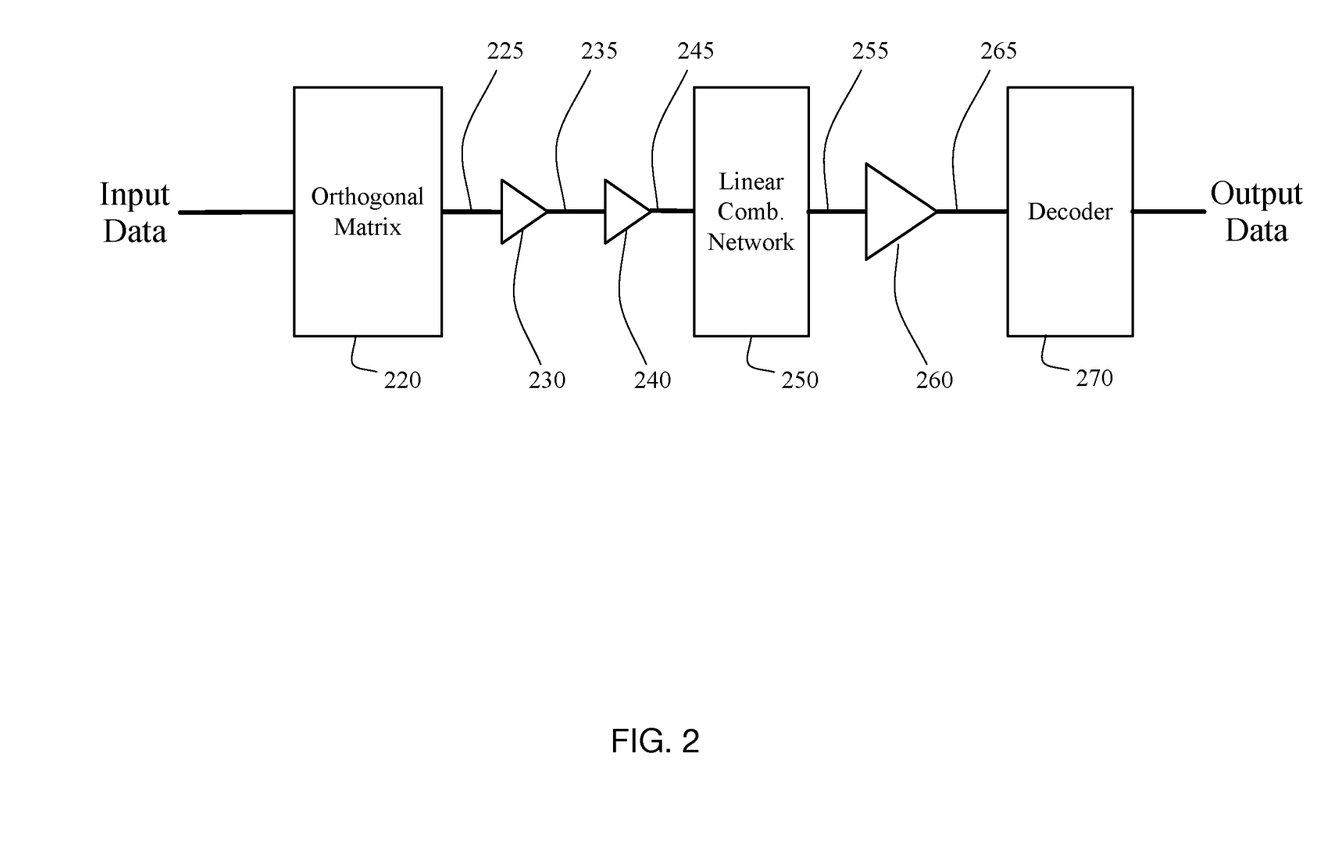
FIG. 2 is a block diagram of a system of vector signaling code communication.

Expanding on the description taught in Cronie I and other prior art, the construction of orthogonal vector signaling codes encoding multi-level Input Data proceeds as illustrated in FIG. 2. Given an interface size N−1 for communications channel 235, an orthogonal matrix A as at 220 is chosen that has N rows and N columns and such that the sum of the columns of A is a column consisting entirely of zeros except in one position (for example, the first position.) Given matrix A and multi-level Input Data described herein as vector c, which may be a PAM-M word, the codewords are constructed via the multiplication $$(0, c_1, c_2, \ldots, c_{N-1}) * A \qquad \text{(Eqn. 1)}$$

wherein the $c_i$ may belong to a constellation of PAM-M values, and wherein PAM-M denotes the set $\{M-1, M-3, \ldots, 3-M, 1-M\}/(M-1)$. By convention, the matrix multiplication of Equation 1 is generally combined with a normalization operation, in which all results are divided by a scaling factor to keep the range of results within the bounds +1 to −1. The N coordinates of the scaled results 225 are transmitted on the N communication wires 235 using drivers 230.

At the receiver, the received values $(v_1, \ldots, v_N)$ on the wires are processed by a receiver frontend 240 that performs tasks such as continuous time linear equalization and amplification to compensate for transmission line losses, and the processed received signals 245 are forwarded to a linear combinatorial network 250. The result of this network 255 is functionally equivalent to performing the matrix multiplication $$B * \begin{pmatrix} v_1 \\ \vdots \\ v_n \end{pmatrix} \qquad \text{(Eqn. 2)}$$

where B is the matrix consisting of rows $2, \ldots, N$ of A in the case where the sum of the columns of A is nonzero in the first position. More generally, if the sum of the columns of the matrix A is nonzero in position k, say, then B consists of all rows of A except row k. Again, by convention this matrix multiplication of Equation 2 is generally combined with a normalization operation in which all results are divided by a scaling factor to keep the range of results within the bounds+1 to −1.

If A is a Hadamard matrix, one example of a suitable linear combinatorial network is that of the well-known Fast Walsh Transform; another example is the multi-input differential comparator of Holden I operated in a linear output mode.

The individual components of this new vector are then passed through a PAM-M detector 260 wherein the thresholds of the detector are set appropriately to detect the M levels produced by the matrix multiplication of Eqn. 2 at 255. These detected results 265 are then decoded 270 to produce Output Data.

Figure 4A:
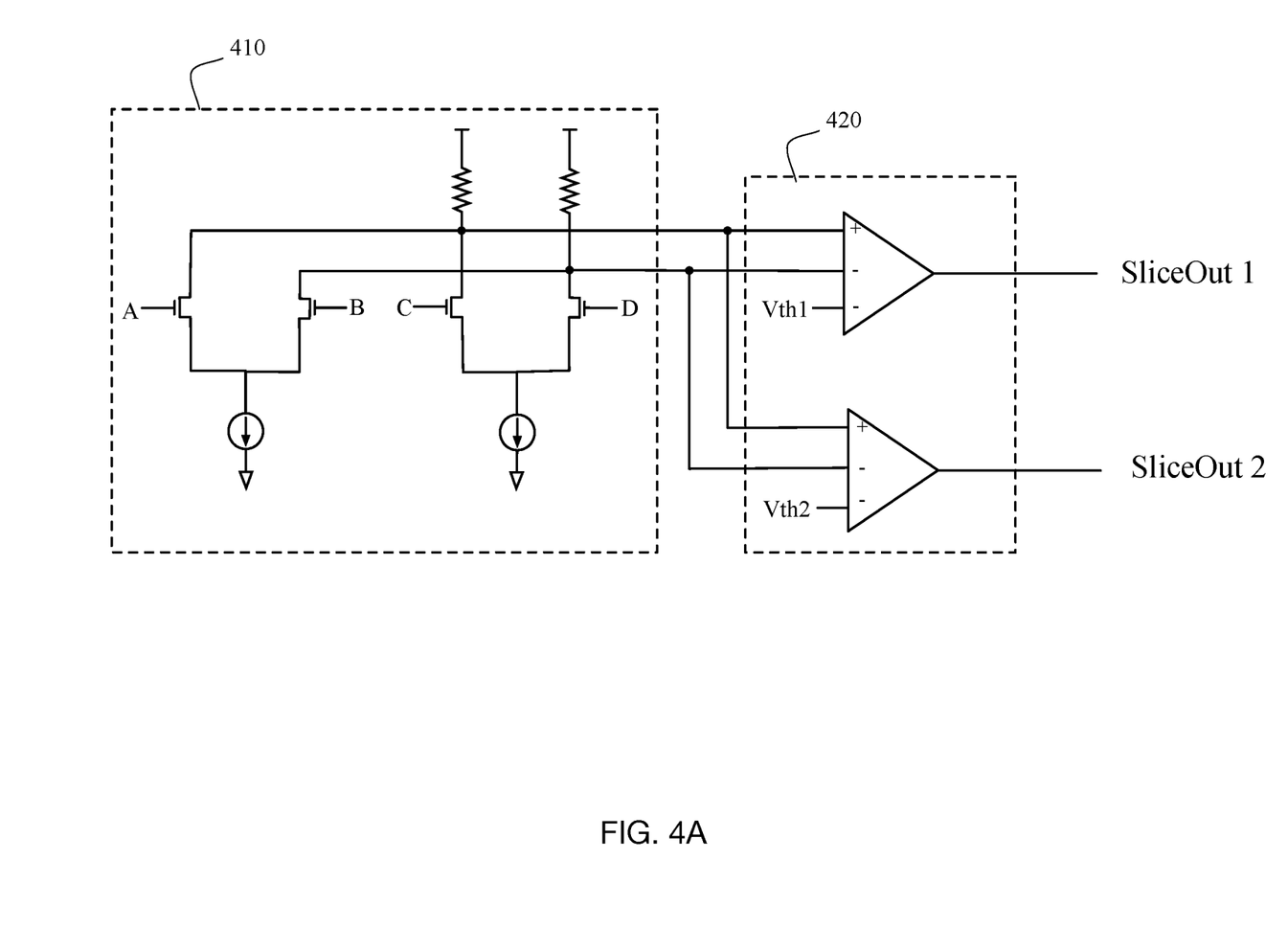
FIG. 4A is a schematic of a circuit for a generalized comparator providing Pulse Amplitude Modulation (PAM)-X slicing.
Figure 4B:
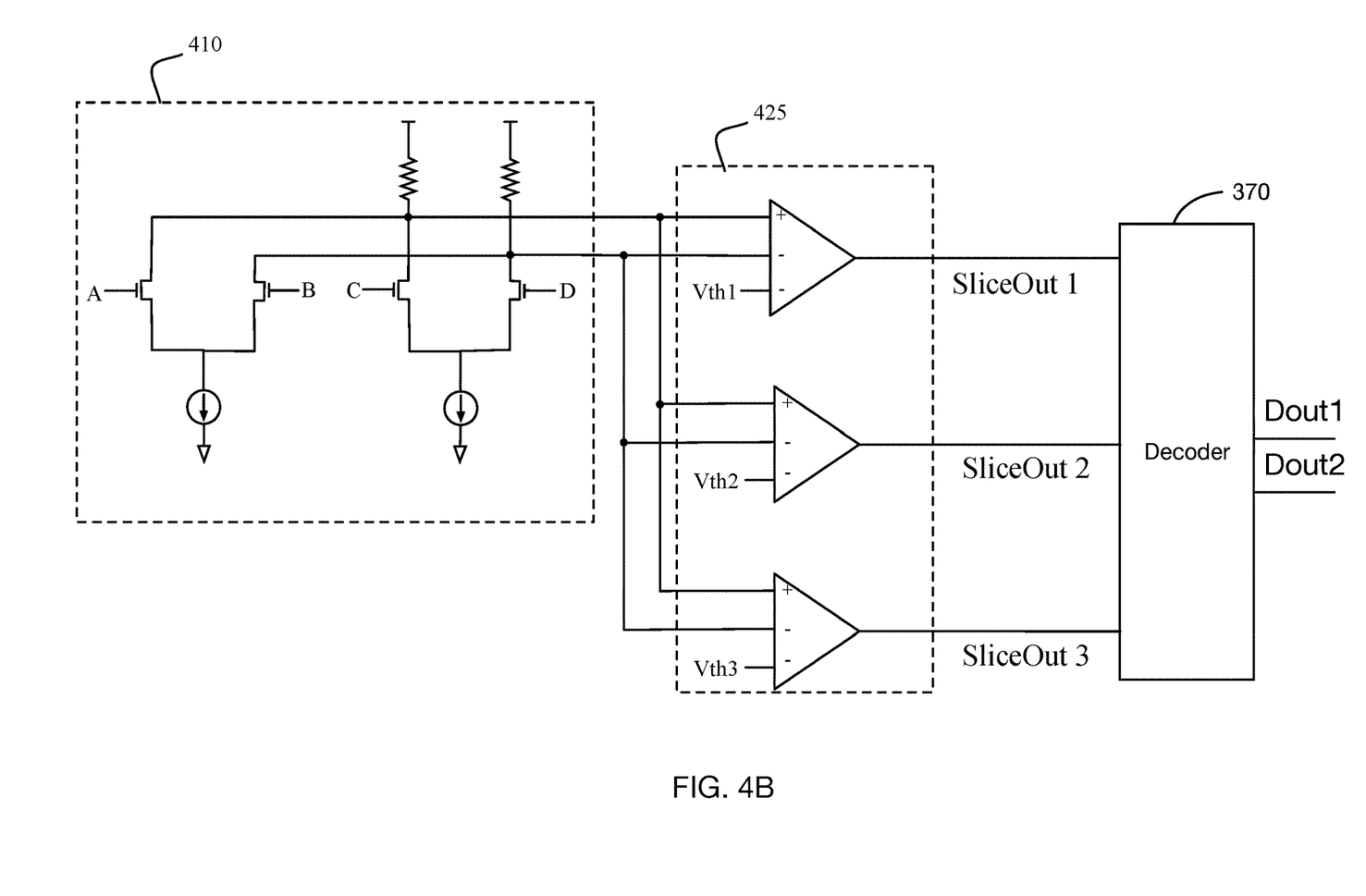
FIG. 4B is a schematic of a PAM-4 slicer operating on an output of a multi-input comparator.

In some embodiments, the PAM-M detector may be a PAM-3 detector 420 as shown in FIG. 4A. As shown, the PAM-3 detector outputs a two-bit thermometer code, where the sliced outputs SliceOut1 and SliceOut 2 of the PAM-3 detector operating on MIC 410 may take on one of three possible values e.g., 'SliceOut1, SliceOut2'='00', '01', or '11'. In such an embodiment, the two-bit output of the PAM-3 detector may be combined in decoder 270 with the two-bit outputs of the rest of the MICs (not shown) to convert the two-bit outputs of the PAM-3 detector into information using e.g., modulus conversion. Alternatively, a PAM-4 detector may be used, as shown in FIG. 4B. In such embodiments the three-bit thermometer outputs SliceOut1 and SliceOut2 and SliceOut3 of PAM-4 detector 425 may take on one of four possible states (i.e., '000', '001', '011' and '111'), and thus the three-bit outputs of the PAM-4 detector may be directly converted to two-bit data outputs Dout1 and Dout2. In such embodiments, each sub-channel may be decoded independently, and no modulus conversion is required.

Alphabet Size

The individual coordinates after the multiplication of Equation 1 may belong to an alphabet of size larger than M, which is the size of the original alphabet of the $c_i$. For example, where A is a Hadamard matrix, the size of the alphabet (that is, the total number of different signal levels transmitted on the wires) may grow to $(N-1)*(M-1)+1$, which can be quite a large number. More significantly, the range of values represented by this enlarged alphabet also grows, thus the normalization operation required to scale the matrix multiplication results to the range +1 to −1 (e.g. so that they may be transmitted over a physical communications medium using fixed and thus limited driver voltage sources) requires division by larger scaling factors, resulting in the steps between alphabet values shrinking. Thus, when transmitted over a noisy communications channel, these increasing scale factors can lead to a reduced signal-to-noise ratio (SNR) on the wire.

This expansion of the matrix multiplication result range is similar to the increased crest factor observed in CDMA communications systems as the number of modulation channels is increased. Either additional transmission power must be provided to support higher peak signal strength, or the overall transmission envelope is maintained within a constrained range and the individual channel SNR decreases.

To avoid these reduced SNR effects, it is desirable to constrain the alphabet required to communicate the results of the Equation 1 multiplication. Cronie II describes pruning of the symbol constellation produced by an encoding matrix multiplications as in Equation 1 to maximize the Euclidian distance between the signals generated by the encoding operation relative to the noise power of the communications channel. Although that constraint method improves SNR, it also significantly reduces the amount of data transmitted per pin or pin efficiency, and does not directly address the increased normalization scaling factor required.

Enhancing Detection SNR

In the method to be applied here we choose the vector $(c_1, c_2, \ldots, c_{N-1})$ from a constrained set of vectors, also called a "pre-code" in the following, in such a way as to decrease the alphabet size produced by the multiplication of Equation 1 by eliminating extreme values, thus eliminating the need for larger normalization factors for the results. In at least one embodiment, the constrained set of vectors is determined as a portion of a maximal set of vectors, and the transformation applied representing multiplication of the constrained set of vectors with a non-simple orthogonal matrix forms constrained-alphabet codewords of a constrained-alphabet vector signaling code. These constrained-alphabet codewords include elements having values selected from a constrained post-transformation alphabet formed by the transformation of the constrained set of vectors. This constrained post-transformation alphabet is a reduced version excluding extreme values (i.e. values having large respective magnitudes) of a non-constrained post-transform alphabet that would be formed by applying the transformation to the maximal set of vectors. As mentioned above, this constrained post-transformation alphabet requires smaller normalization factors, which in turn increases the SNR of a system in accordance with at least one embodiment of the invention.

Figure 3:
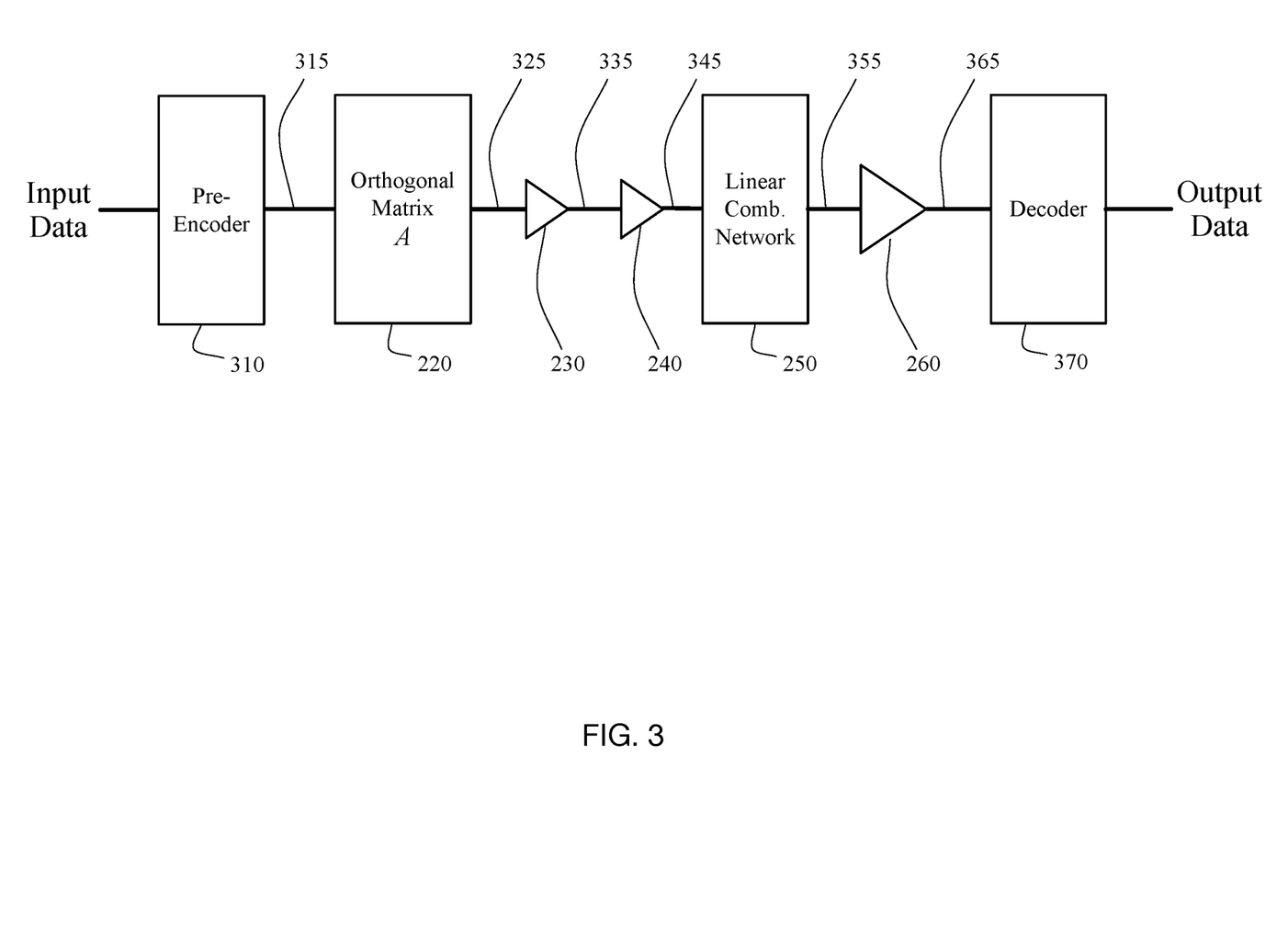
FIG. 3 is a block diagram of illustrating vector code signaling communication using a pre-coding operation to constrain the code space alphabet.

This can be done in a variety of ways, as described below using the illustration of FIG. 3. Pre-encoder 310 maps a given number of Input Data bits (or higher-order symbols)

into a codeword 315 of the pre-code prior to encoding matrix multiplication 320, and a decoder 370 maps the detected results 365 to Output Data bits (or higher order symbols.) Decoder 370 may incorporate both a pre-code decoding function and the result mapping decode operation of decoder 270 of FIG. 2; in some embodiments, one or both of these decoding operations may be null or a direct mapping. Encoding matrix 220, decoding linear combinatorial network 250, PAM-X slicer 260, driver 230, and receiver front end 240 are functionally identical in their FIG. 2 and FIG. 3 depictions, while signals 325, 335, and 345 are numbered as distinct from their respective FIG. 2 equivalents 225, 235, and 245 solely due to the range constraint of their values produced by the invention in their FIG. 3 versions.

Forcing to Zero

In a first example embodiment, a given number of the $c_i$ are forced to be zero, constraining the scope of the resulting matrix multiplication results. Where k of the $c_i$ are forced to be equal to zero, the constrained post-transformation alphabet size after the multiplication in Equation 1 will grow to at most a size of $(N-k-1)*(M-1)+1$ for a Hadamard matrix. This can be substantially smaller in certain cases. Moreover, unlike in the method of Cronie II, the reduction of the code-space may not be too much. Since the forced value of 0 will be part of the detected results (as in 355 of FIG. 3) and needs to be detected, this method is applied when the $c_i$ belong to a PAM-M constellation with M being an odd number.

As a specific example, consider an embodiment with N=4, M=3, and the Hadamard matrix of size 4. In this case the unconstrained pre-code has 27 elements, and the unconstrained post-transform alphabet size is 7. However, choosing a constrained set of vectors ($c_1$, $c_2$, $c_3$) which contain at least one zero, i.e., k=1, a constrained post-transform alphabet having a size of 5 is formed. The number of such constrained-alphabet codewords is 19; the 12 permutations of (1,0,0,−1), the 6 permutations of (½,½,−½,−½), and the vector (0,0,0,0). In at least one embodiment, the codeword (0,0,0,0) is not chosen for transmission, in order to have the same amount of power used for every transmitted codeword. Among the remaining 18 constrained-alphabet codewords any 16 can be chosen for transmission, encoding four binary bits of data. The remaining two constrained-alphabet codewords are available for control functions, pattern breaking, or other auxiliary communication use.

An encoder embodiment for the precode operation is now described with reference to the specific precode consisting of all the 12 permutations of the vector (1,0,0,−1), and the four additional vectors (½, ½, −½, −½), (−½, ½, ½, −½), (−½, −½,½,½), and (½,−½,−½,½). The task of this encoder is to produce four bit vectors u, v, w, s from a four bit input (a,b,c,d). In operation, the encoded vector is equal to u−v+(w−s)/2. In other words, u encodes the positions of the 1's, v encodes the position of the −1's, w encodes the positions of the ½'s, and s encodes the positions of the −½'s. Explicit logical formulas are given below. In these formulas, "*" is the logical AND, ¬c is the logical inverse of c, "xor" denotes the xor operation, and "nor" denotes the logical NOR operation.

If (a*b)=0, then:
u=(c*d,¬c*d,c*¬d,nor(c,d))
v=(xor(c,¬a)*xor(d,¬b),xor(c,a)*xor(d,¬b),xor(c,¬a)* xor(d,b),xor(c,a)*xor(d,b)
w=(0,0,0,0), s=(0,0,0,0)

If (a*b)=1, then:
u=(0,0,0,0)
v=(0,0,0,0)
w=(¬xor(c,d), ¬c, xor(c,d), c)
s=(xor(c,d), c, (¬xor(c,d), ¬c)

As a second example, consider an embodiment with N=8, M=3, and the Hadamard matrix of size 8. In this case the unconstrained pre-code has $3^7=2187$ elements and an unconstrained post-transformation alphabet of size $(N-1)*(M-1)+1=15$. Choosing a pre-code comprising all PAM-3 vectors of length 7 with at least one 0, one obtains a pre-code of size 2187−128=2059 which means that it is still possible to transmit 11 bits on the 8 communication wires. The constrained post-transformation alphabet has a size of $(N-2)*(M-1)+1=13$. The SNR increase is 20*log 10(15/13)=1.24 dB.

In an alternative embodiment where k=4, i.e. in which it is required that at least four of the coordinates of ($c_1$, $c_2$, . . . , $c_7$) be zero, this construction yields a pre-code of size 379 which is sufficient for transmission of 8 bits on the 8 wires. The constrained post-transformation alphabet size is in this case 3*(M−1)+1=7. The SNR increase is 20*log 10(15/7)=6.62 dB. This SNR increase was achieved by reducing the rate from 11 bits to 8 bits on 8 wires, i.e., by a reduction of the rate by roughly 38%.

Table I shows the SNR increase for embodiments N=8, M=5, and various values of k. In this case the unconstrained pre-code is capable of transmitting 16 bits over the 8 wire interface.

TABLE I

|  | k = 0 | k = 1 | k = 2 | k = 3 | k = 4 |
| --- | --- | --- | --- | --- | --- |
| #bits | 15 | 15 | 13 | 11 | 8 |
| SNR increase | 2.97 | 6.46 | 10.7 | 16.0 | 23.4 |

It may be observed from the results of Table I that it is advantageous to increase the SNR by 6.46 dB (i.e. k=1) while losing 1 bit over the unconstrained transmission. Transmission with a pin efficiency of 1 (8 binary bits over the 8 wire interface) is also possible (k=4) and leads to an SNR increase of 23.4 dB.

Explicit Codespace Pruning

Although the 'forcing to zero' method requires only a fairly simple pre-coder, other methods of constraining the emitted set of codewords to avoid extreme alphabet values may provide more flexibility and/or a larger usable codespace.

As a first example, consider an embodiment in which the matrix A is the Hadamard matrix of order 8, and where M=2, i.e., the $c_i$ are +1 or −1. Without a pre-code, the size of the unconstrained post-transformation alphabet after the multiplication in Equation 1 is 8, and the unconstrained post-transformation alphabet (after normalization) consists of the values ±1, ±5/7, ±3/7, ±1/7. There are exactly 16 vectors (0, $c_1$, . . . ,$c_7$) leading to the alphabet elements ±1. These are the codewords of the [7,4,3] Hamming code (using binary antipodal modulation of the bits):

[[1, 1, 1, 1, 1, 1, 1], [−1, −1, −1, 1, 1, 1, 1], [−1, 1, 1, −1, −1, 1, 1], [1, −1, −1, −1, −1, 1, 1], [1, −1, 1, −1, 1, −1, 1], [−1, 1, −1, −1, 1, −1, 1], [−1, −1, 1, 1, −1, −1, 1], [1, 1, −1, −1, −1, 1, 1, −1], [1, 1, −1, −1, 1, 1, −1], [−1, −1, 1, 1, 1, 1, −1], [−1, 1, −1, 1, −1, 1, −1], [1, −1, 1, 1, −1, 1, −1], [−1, 1, 1, 1, −1, −1], [1, −1, −1, 1, 1, −1, −1], [1, 1, 1, −1, −1, −1, −1], [−1, −1, −1, −1, −1, −1, −1]].

Thus, this method comprises identification of matrix multiplication results containing predetermined unacceptable alphabet values and the particular input values to that multiplication which results in generation of those codewords. The pre-code operation thus requires elimination (or equivalently, exclusion from the data-to-precode mapping) of those matrix multiplication input vectors. For descriptive purposes, this document refers to this method of pre-coding as "explicit codespace pruning", as the pre-code explicitly avoids generating particular output vectors leading to unacceptable codewords.

Disallowing these vectors, the result of the multiplication in Equation 1 will belong to a constrained post-transformation alphabet of size 6, which after normalization can be viewed as ±1, ±⅗, ±⅕. The resulting vector signaling code is capable of transmitting one of 128−16=112 codewords in every transmission, and its SNR is $20*\log_{10}(4/3)=2.5$ dB better than the unconstrained case. The rate loss of this signaling code as compared to the unconstrained code is $7-\log_2(112)$~0.19, which is less than 3%.

Another example is provided by an embodiment in which N=8, and M=4. In this case A is again a Hadamard matrix of size 8. If the vectors $(0, c_1, \ldots, c_7)$ are unconstrained, then the size of the resulting unconstrained post-transformation alphabet is 22. By disallowing the same 16 vectors as in the previous example, the size of the constrained post-transformation alphabet is reduced to 20 and the SNR is increased by 20*log 10(22/20)=0.83 dB. Disallowing another appropriate set of 112 vectors leads to a constrained post-transformation alphabet of size 18 and an increase of SNR by 20*log 10(22/18)=1.74 dB. The set to be disallowed is obtained in the following way: We choose for the vector $(0, c_1, \ldots, c_7)$ all possible combinations except those in which $(c_1, \ldots, c_7)$ is one of the vectors of the [7,4,3] Hamming code above, or if $(c_1, \ldots, c_7)$ is obtained from such a vector by replacing any of the entries by ±⅓, and wherein the sign is chosen to be equal to the sign of the original entry (so, for example, the vector (−1, −⅓, −1, 1, 1, 1, 1) is disallowed since it is obtained from the vector (−1,−1,−1,1,1,1,1) by replacing the third entry by −⅓). Further improvements of the SNR are possible by disallowing a progressive number of possibilities for the vector $(c_1, \ldots, c_7)$: Disallowing another 448 vectors reduces the number of codewords of the precode to $4^7-448-112-16=15808$, i.e., reduces the number of transmitted bits from 14 to 13.94, reduces the alphabet size to 16, and increases the SNR by 20*log 10(22/16)=2.76 dB.

Figure 5:
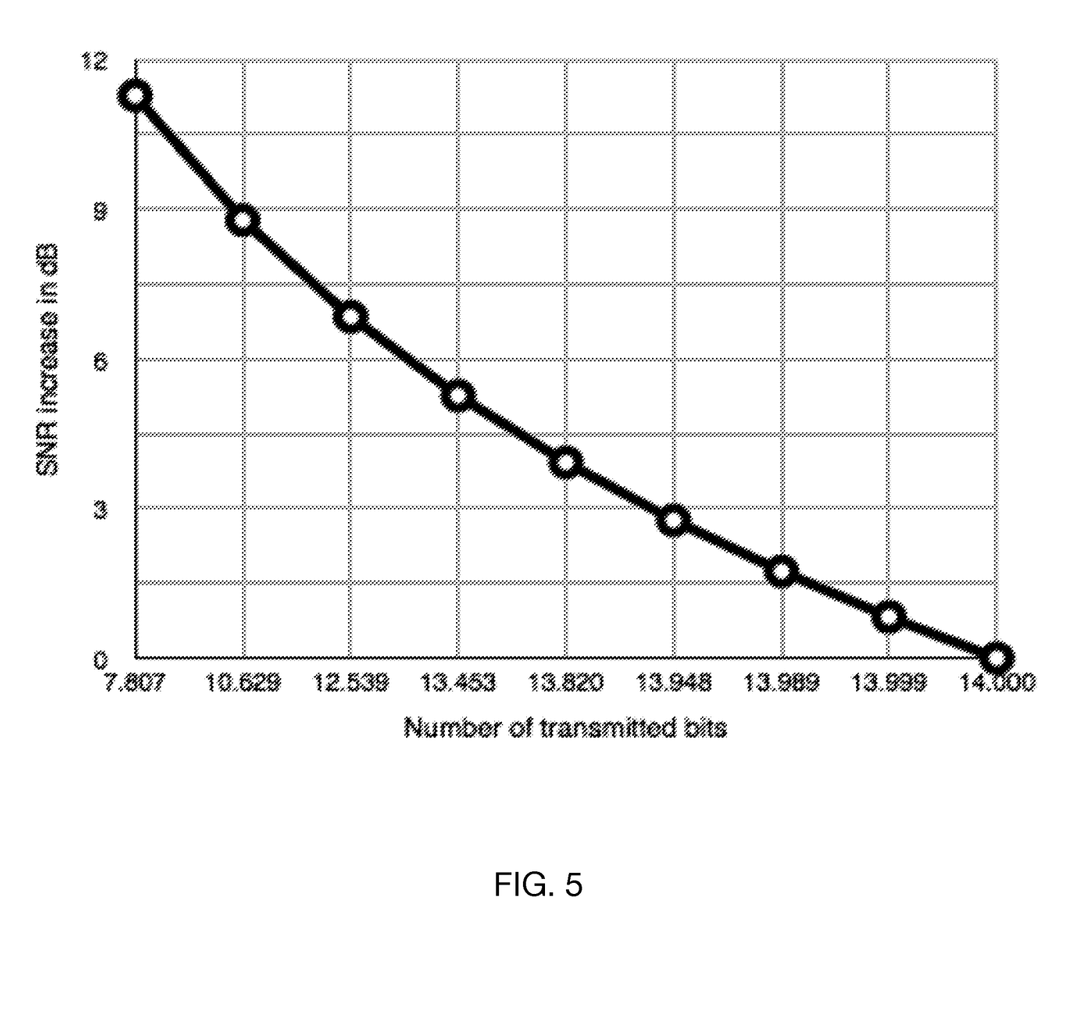
FIG. 5 is a graph showing SNR increase versus number of transmitted bits per codeword for one embodiment of the invention.

FIG. 5 shows the evolution of the increase in SNR versus the number of transmitted bits if this process is continued down to an alphabet of size 6. In that case, about 7.8 bits are transmitted on the 8 wires, while the SNR is increased by 11.3 dB.

Explicit codespace pruning is not only applicable to PAM-M transmission when M is even. It can also be applied to the case of odd M. An example is provided by an embodiment in which N=8, and M=3. In this case A is again a Hadamard matrix of size 8. If the vectors $(0, c_1, \ldots, c_7)$ are unconstrained, then the size of the resulting unconstrained post-transformation alphabet is 15. By disallowing the same 16 vectors as in the example for M=2, the size of the constrained post-transformation alphabet is reduced to 13 and the SNR is increased by 20*log 10(15/13)=1.24 dB, while the number of codewords is reduced from $3^7=2187$ to 2171. The number of transmitted bits is reduced from 11.095 to 11.084. This same result is achieved by the zero-forcing method.

Disallowing a further set of 112 vectors leads to a constrained post-transformation alphabet of size 11 and an increase of SNR by 20*log 10(15/11)=2.69 dB. The set to be disallowed is obtained in the following way: We choose for the vector $(0, c_1, \ldots, c_7)$ all possible combinations except those in which $(c_1, \ldots, c_7)$ is one of the vectors of the [7,4,3] Hamming code above, or if $(c_1, \ldots, c_7)$ is obtained from such a vector by replacing any of the entries by 0 (so, for example, the vector (−1, 0, −1, 1, 1, 1, 1) is disallowed since it is obtained from the vector (−1,−1,−1,1,1,1,1) by replacing the third entry by 0).

Further improvements of the SNR are possible by disallowing a progressive number of possibilities for the vector $(c_1, \ldots, c_7)$: Disallowing another 448 vectors reduces the number of codewords of the precode to $3^7-448-112-16=1611$, i.e., reduces the number of transmitted bits from $11.095=\log_2(3^7)$ to 10.65, reduces the constrained post-transformation alphabet size to 9, and increases the SNR by 20*log 10(15/9)=4.44 dB.

Figure 6:
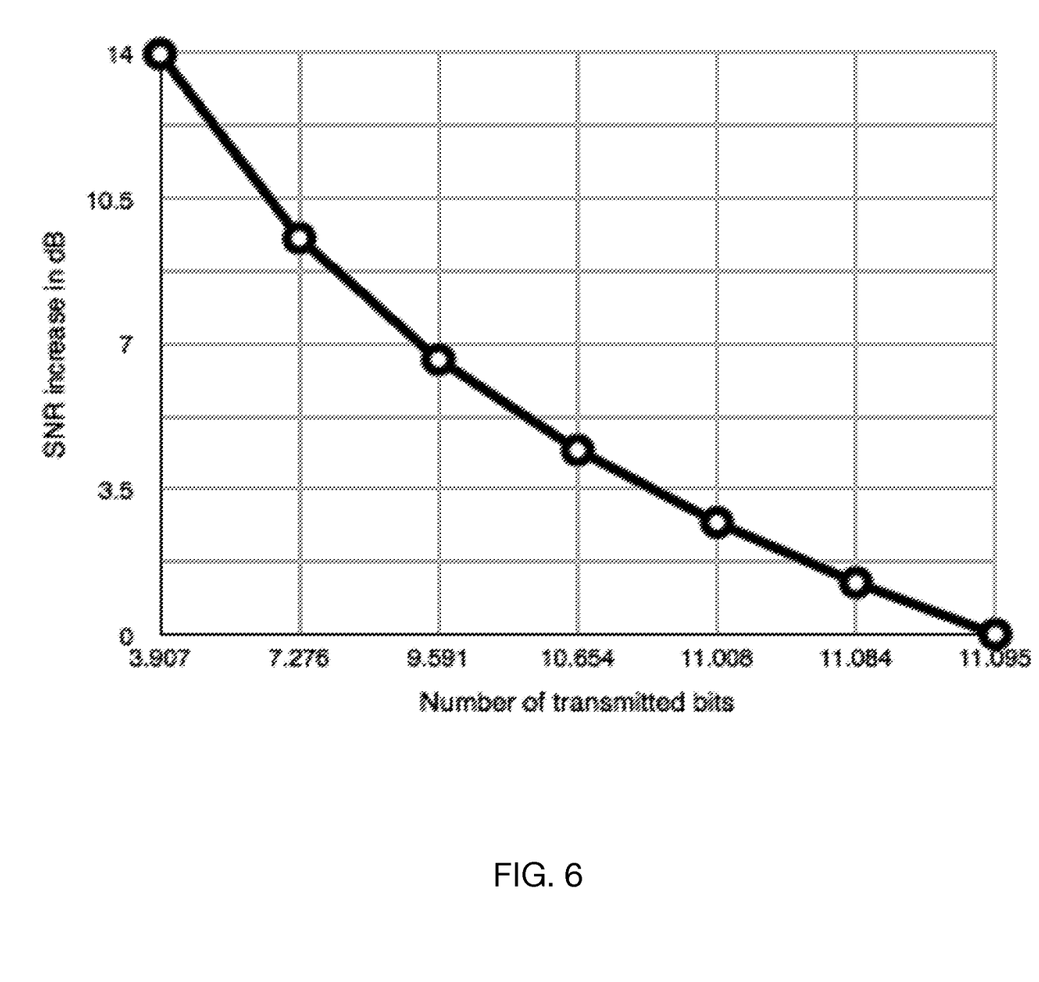
FIG. 6 is a graph showing SNR increase versus number of transmitted bits per codeword for another embodiment of the invention.

FIG. 6 shows the evolution of the increase in SNR versus the number of transmitted bits if this process is continued down to an alphabet of size 3. In that case, about 3.9 bits are transmitted on the 8 wires, while the SNR is increased by 13.98 dB.

Offline Codebook Generation

Figure 7:
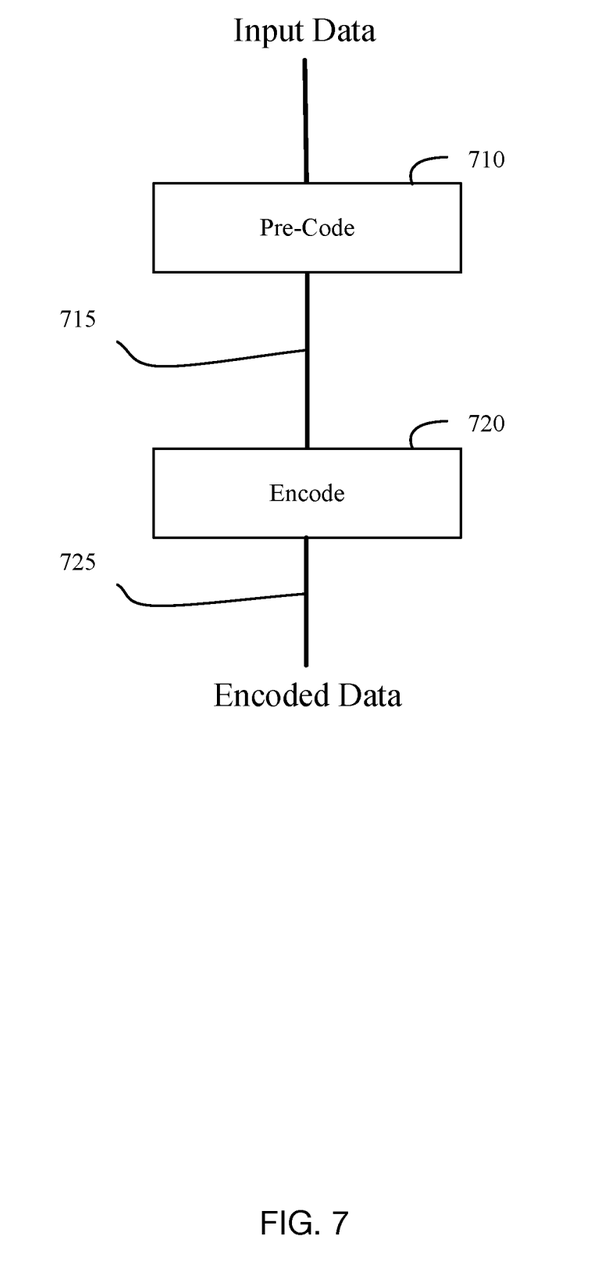
FIG. 7 is a block diagram showing a method of obtaining improved SNR using vector signaling codes with a constrained alphabet.

A generic diagram illustrating the previously described methods is shown as the block diagram of FIG. 7. Given the goal of producing encoded outputs 725 not containing codewords having extreme alphabet values, Input Data is pre-coded 710, producing an interim vector 715 which, when encoded 720 by a matrix operation, produces a satisfactory Encoded Data 725 result. The pre-coding step may be based on expanding the Input data into a vector containing forced zero values, mapping the input data into allowable vectors rather than disallowed vectors which would lead to unwanted codes, etc.

Figure 8:
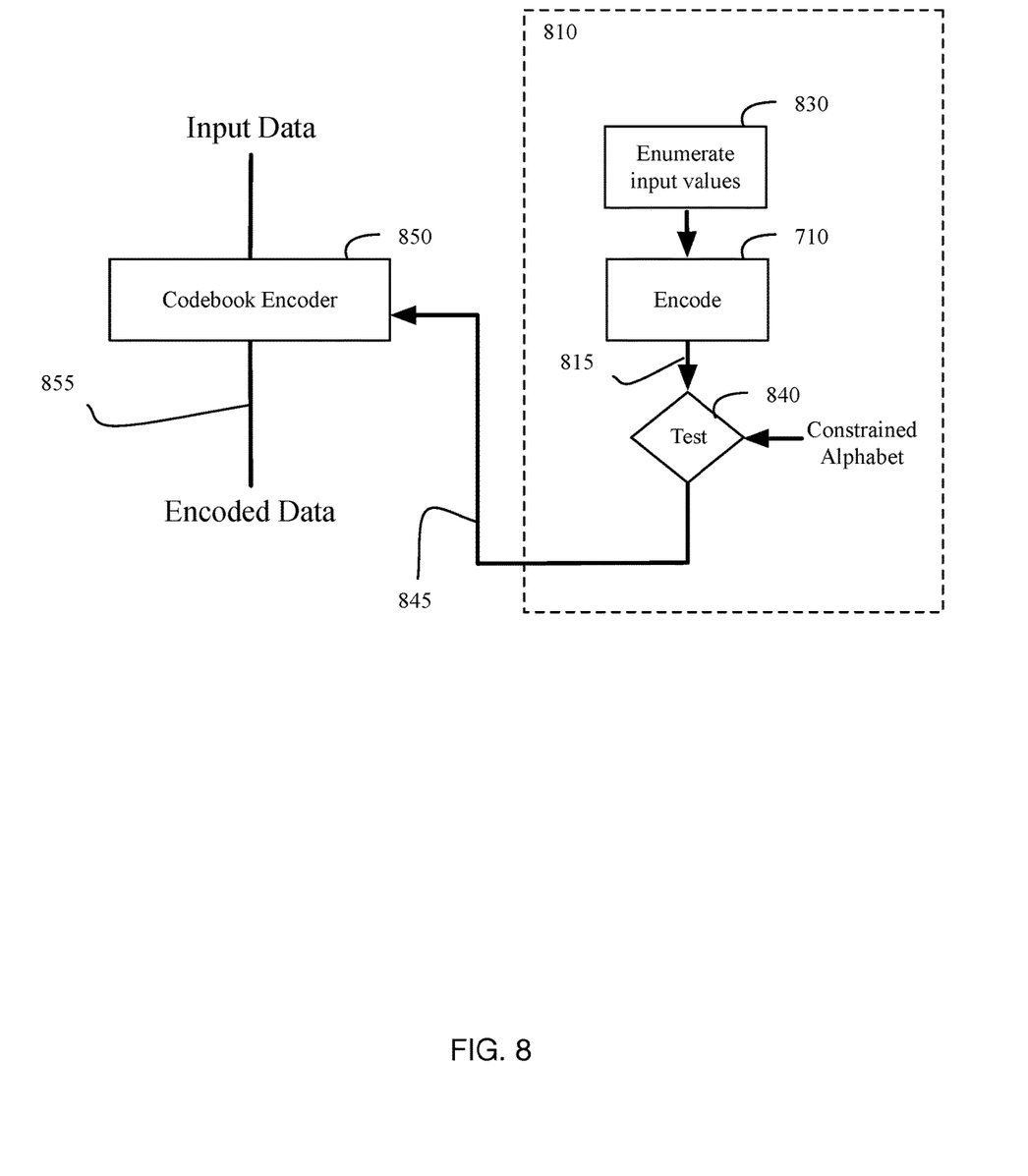
FIG. 8 is a block diagram showing an alternative method of obtaining improved SNR using vector signaling codes with a constrained alphabet, wherein the constraint computations are performed offline.

As shown in FIG. 8, the previously-described encoding methods may be incorporated in an offline analysis process 810. A constrained post-transformation alphabet is determined, being a proper subset of the original unconstrained post-transformation alphabet from which extreme alphabet values are excluded. All possible (i.e. encodable by matrix multiplication 710) values are enumerated and each such value encoded by matrix multiplication 710, producing all possible codewords 815. Each codeword 815 is tested 840 to verify every symbol of that codeword is a member of the constrained post-transformation alphabet. The resulting set of codewords passing this test 845 may then be used by a codebook encoder 850 which performs a simple codebook lookup, mapping each Input Data value to a selected codeword of the set of codewords 845, and outputting the selected codeword as its Encoded Data output.

Combination Designs

It will be apparent to one familiar with the art that the functional combinations and resulting circuit optimizations taught in the prior art may be equally well applied in combination with the present invention.

One embodiment illustrated as FIG. 4A utilizes a multi-input comparator 410 as taught by Holden I or Ulrich I to integrate linear combinatorial network 250 and PAM-X slicer 260 and obtain binary outputs representing the PAM-X values. In this integrated design, multiple input differential front end stage 410 (herein shown without limitation as paralleled differential amplifier elements sharing common loads as in Ulrich I) processes receiver signals A, B, C, and D, while each high gain digital comparator element of back end 420 (herein shown without limitation as a pair of high gain comparators) is provided with a reference or offset voltage appropriate to slice the combinatorial network outputs produced by 410 at one or more PAM-X threshold levels. In a preferred embodiment, multiple comparator outputs shown in FIG. 4A as SliceOut1 and SliceOut2 having reference level offsets Vth1 and Vth2 respectively, are associated with each integrated design instance. As will be obvious to one familiar with the art, any of a wide range of known PAM-X slicers, comparators, or threshold detectors may be used in place of the example comparators.

EMBODIMENTS

In accordance with at least one embodiment, a system comprises: a plurality of conductors configured to receive a set of input data bits; a pre-encoder configured to map the set of input data bits into symbols of a pre-code codeword of a pre-code, wherein the pre-code comprises a constrained set of vectors determined from a maximal set of vectors, and wherein the pre-code is associated with a constrained post-transformation alphabet comprising a portion of low magnitude symbol values selected from an unconstrained post-transformation alphabet associated with the maximal set of vectors; an encoder configured to generate a constrained-alphabet codeword of a constrained-alphabet vector signaling code, the constrained-alphabet codeword representing a transformation of the pre-code codeword with a first non-simple orthogonal matrix, wherein the constrained-alphabet codeword comprises symbols of the constrained post-transformation alphabet; and, a driver configured to transmit the constrained-alphabet codeword on a multi-wire communication bus.

In at least one embodiment, each vector in the constrained set comprises N−1 symbols, each symbol having a value selected from a constellation of PAM-M values, and the first non-simple orthogonal matrix has a size of N, wherein N and M are integers greater than or equal to 3. In at least one embodiment, the unconstrained post-transformation alphabet comprises $(N-1)*(M-1)+1$ possible symbol values. In at least one embodiment, M is odd, and wherein each vector in the constrained set comprises k symbols equal to 0, and the constrained post-transformation alphabet comprises $(N-k-1)*(M-1)+1$ possible symbol values, wherein k is an integer greater than or equal to 1.

In at least one embodiment, the constrained post-transformation alphabet comprises predetermined low magnitude values selected from the unconstrained post-transformation alphabet. In at least one embodiment, the portion of low magnitude symbol values have magnitudes under a predetermined threshold.

In at least one embodiment, the first non-simple orthogonal matrix is a Hadamard matrix. In at least one embodiment, the Hadamard matrix has a size of at least 4. In at least one embodiment, the pre-encoder comprises logic elements configured to map the set of input data bits to the pre-code codeword. In at least one embodiment, the constrained-alphabet vector signaling code is a balanced code. In at least one embodiment, the constrained-alphabet vector signaling code is ternary.

In at least one embodiment, the system further comprises a receiver, the receiver comprising: a multi-wire communication bus configured to receive the constrained-alphabet codeword; a linear combination network configured to obtain the pre-code codeword based on a transformation of the constrained-alphabet codeword by a second non-simple orthogonal matrix, the second non-simple orthogonal matrix based on the first non-simple orthogonal matrix; and, a detector configured to detect the symbols of the pre-code codeword, and generate a set of output data bits representative of the set of input data bits. In at least one embodiment, the detector is a PAM-M detector, the PAM-M detector comprising a plurality of comparators configured to generate a plurality of comparator outputs, each comparator associated with a respective reference voltage of a set of reference voltages, and wherein the plurality of comparator outputs correspond to the output data bits.

Figure 9:
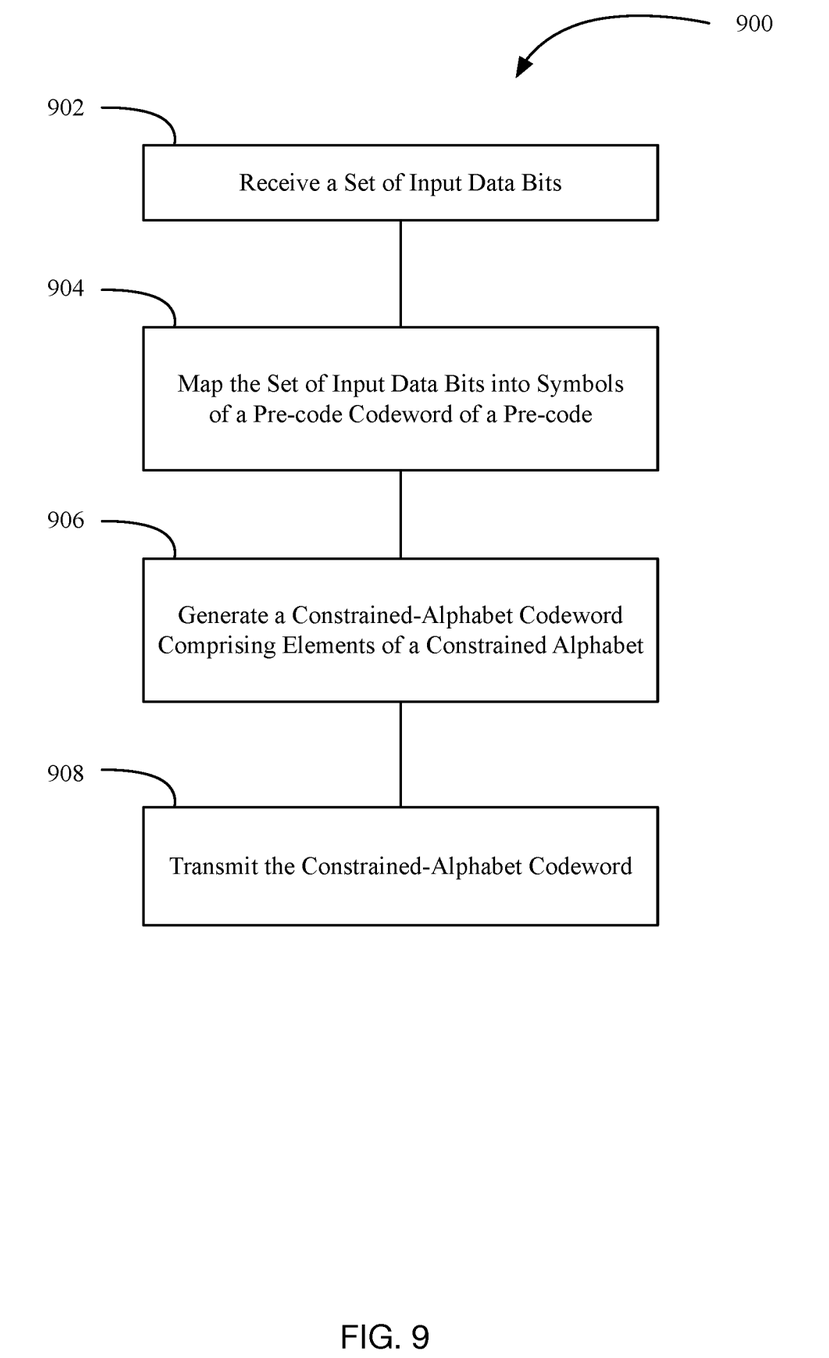
FIG. 9 is a flowchart showing a method in accordance with at least one embodiment of the invention.

In at least one embodiment in accordance with FIG. 9, a method 900 comprises: receiving a set of input data bits on a plurality of conductors at step 902; mapping the set of input data bits into symbols of a pre-code codeword of a pre-code, the pre-code corresponding to a constrained set of vectors determined from a maximal set of vectors at step 904; generating a constrained-alphabet codeword comprising elements of a constrained alphabet, the constrained-alphabet codeword representing a transformation of the pre-code codeword with a non-simple orthogonal matrix, wherein the constrained alphabet comprises a number m of low magnitude symbol values, the number m less than a total number n of symbol values in an unconstrained alphabet generated by transforming the maximal set of vectors with the non-simple orthogonal matrix, and wherein n and m are integers, n greater than 1 and m greater than 2 at step 906; and, transmitting the constrained-alphabet codeword at step 908.

In at least one embodiment, each vector in the constrained set comprises N−1 symbols, each symbol having a value selected from a constellation of PAM-M values, and the first non-simple orthogonal matrix has a size of N, wherein N and M are integers greater than or equal to 3. In at least one embodiment, the unconstrained alphabet comprises $n=(N-1)*(M-1)+1$ possible symbol values. In at least one embodiment, M is odd, and wherein each vector in the constrained set comprises k symbols equal to 0, and the constrained alphabet comprises $m=(N-k-1)*(M-1)+1$ possible symbol values, wherein k is an integer greater than or equal to 1.

In at least one embodiment, the constrained alphabet comprises predetermined low magnitude values selected from the unconstrained alphabet. In at least one embodiment, each of the m low magnitude symbol values have magnitudes under a predetermined threshold.

In at least one embodiment, the non-simple orthogonal matrix is a Hadamard matrix. In at least one embodiment, the Hadamard matrix has a size of at least 4. In at least one embodiment, the constrained-alphabet vector signaling code is a balanced code. In at least one embodiment, the constrained-alphabet vector signaling code is ternary.

In at least one embodiment, the method further comprises: receiving the constrained-alphabet codeword on a plurality of conductors; obtaining the pre-code codeword based on a transformation of the constrained-alphabet codeword with a second non-simple orthogonal matrix, the second non-simple orthogonal matrix based on the first non-simple orthogonal matrix; and, generating a set of output data bits by a detector, wherein the set of output data bits is generated based on the pre-code codeword, and are representative of the set of input data bits. In at least one embodiment, generating the set of output data bits comprises forming a plurality of comparator outputs using a plurality of comparators, each comparator associated with a respective reference voltage of a set of reference voltages.

The examples presented herein describe the use of vector signaling codes for communication over a point-to-point wire interconnection. However, this should not been seen in any way as limiting the scope of the described invention. The methods disclosed in this application are equally applicable to other interconnection topologies and other communication media including optical, capacitive, inductive, and wireless communications, which may rely on any of the characteristics of the described invention, including minimization of reception or detection resources by selective modification or subset selection of code space. The methods disclosed in this application are equally applicable to embodiments where the encoded information is stored and subsequently retrieved, specifically including dynamic and static random-access memory, non-volatile memory, and flash programmable memory. Descriptive terms such as "voltage" or "signal level" should be considered to include equivalents in other measurement systems, such as "optical intensity", "RF modulation", "stored charge", etc.

As used herein, the term "physical signal" includes any suitable behavior and/or attribute of a physical phenomenon capable of conveying information. Physical signals may be tangible and non-transitory. "Code" and "codeword" may represent physically-representable constructs, capable of being recorded in physical media, embodied as physical devices, and communicated as measurable physical signals over physical interconnections.

We claim:

1. A method comprising:
receiving a plurality of codewords, each codeword sequentially received as a plurality of symbols in parallel over respective wires of a multi-wire channel, the symbols of each codeword having symbol values belonging to a constrained alphabet associated with a limited set of weighted summations of a plurality of mutually orthogonal sub-channel vectors according to a constrained set of pulse amplitude modulation (PAM)-M words, wherein M is an integer greater than two;
generating, for each codeword, a PAM-M word from the constrained set of PAM-M words, each PAM-M word comprising a plurality of outputs generated by forming respective linear combinations of the plurality of symbols of the codeword according to respective sub-channel vectors of the plurality of mutually-orthogonal sub-channel vectors; and
mapping each PAM-M word to a set of output signals.

2. The method of claim 1, wherein the constrained alphabet omits a first pair of extreme values formed by weighted summations of the plurality of mutually orthogonal sub-channel vectors according to a first group of PAM-M words outside of the constrained set of PAM-M words that constructively add to one of the extreme values in any one symbol of the plurality of symbols of a given codeword.

3. The method of claim 2, wherein the constrained alphabet omits a second pair of extreme values formed according to a second group of PAM-M words outside of the constrained set of PAM-M words.

4. The method of claim 3, wherein each PAM-M word of the second group comprises one zero value.

5. The method of claim 1, wherein the constrained set of PAM-M words omits a PAM-M word having all zero elements.

6. The method of claim 1, wherein each PAM-M word comprises N-1 outputs, and wherein the plurality of mutually orthogonal sub-channel vectors correspond to rows of a Hadamard matrix of size N, wherein N is a power of two integer.

7. The method of claim 6, wherein N=8, and wherein the constrained alphabet comprises 11 symbol values.

8. The method of claim 6, wherein each PAM-M word of the constrained set of PAM-M words comprises k outputs equal to zero, and wherein the constrained alphabet comprises (N−k−1)*(M−1)+1 symbol values.

9. The method of claim 1, wherein generating the plurality of outputs of each PAM-M word comprises slicing analog values associated with the respective linear combinations against a plurality of reference voltages to generate bits representing the analog values of the PAM-M word.

10. The method of claim 9, wherein mapping each PAM-M word to the set of output signals comprises decoding the bits representing the analog values of the PAM-M word.

11. An apparatus comprising:
a set of multi-input comparators (MICs) configured to receive a plurality of codewords, each codeword sequentially received as a plurality of symbols in parallel over respective wires of a multi-wire channel, the symbols of each codeword having symbol values belonging to a constrained alphabet associated with a limited set of weighted summations of a plurality of mutually orthogonal sub-channel vectors according to a constrained set of pulse amplitude modulation (PAM)-M words, wherein M is an integer greater than two;
the MICs further configured to generate, for each codeword, a plurality of outputs of a PAM-M word from the constrained set of PAM-M words, each MIC configured to generate a respective output generated by forming a respective linear combination of the plurality of symbols of the codeword according to a respective sub-channel vectors of the plurality of mutually-orthogonal sub-channel vectors; and
a decoder configured to map each PAM-M word to a set of output signals.

12. The apparatus of claim 11, wherein the constrained alphabet omits a first pair of extreme values formed by weighted summations of the plurality of mutually orthogonal sub-channel vectors according to a first group of PAM-M words outside of the constrained set of PAM-M words that constructively add to one of the extreme values in any one symbol of the plurality of symbols of a given codeword.

13. The apparatus of claim 12, wherein the constrained alphabet omits a second pair of extreme values formed according to a second group of PAM-M words outside of the constrained set of PAM-M words.

14. The apparatus of claim 13, wherein each PAM-M word of the second group comprises one zero value.

15. The apparatus of claim 11, wherein the constrained set of PAM-M words omits a PAM-M word having all zero elements.

16. The apparatus of claim 11, wherein each PAM-M word comprises N-1 outputs, and wherein the plurality of mutually orthogonal sub-channel vectors correspond to rows of a Hadamard matrix of size N, wherein N is a power of two integer.

17. The apparatus of claim 16, wherein N=8, and wherein the constrained alphabet comprises 11 symbol values.

18. The apparatus of claim 16, wherein each PAM-M word of the constrained set of PAM-M words comprises k outputs equal to zero, and wherein the constrained alphabet comprises (N−k−1)*(M−1)+1 symbol values.

19. The apparatus of claim 11, further comprising a plurality of PAM-M slicers configured to generate slice the plurality of outputs of each PAM-M word against a plurality of reference voltages to generate bits representing the plurality of outputs of the PAM-M word.

20. The apparatus of claim 19, wherein the decoder is configured to convert the bits representing the plurality of outputs of each PAM-M word to the set of output signals.

* * * * *